(12) United States Patent
Lockenhoff

(10) Patent No.: US 9,326,421 B2
(45) Date of Patent: Apr. 26, 2016

(54) ARRANGEMENT AND METHOD FOR COOLING A SUPPORT

(75) Inventor: Rudiger Lockenhoff, Bietigheim-Bissingen (DE)

(73) Assignee: AZUR SPACE SOLAR POWER GMBH, Heilbronn (DE)

( * ) Notice: Subject to any disclaimer, the term of this patent is extended or adjusted under 35 U.S.C. 154(b) by 291 days.

(21) Appl. No.: 13/979,225

(22) PCT Filed: Jan. 11, 2012

(86) PCT No.: PCT/EP2012/050334
§ 371 (c)(1),
(2), (4) Date: Aug. 29, 2013

(87) PCT Pub. No.: WO2012/095437
PCT Pub. Date: Jul. 19, 2012

(65) Prior Publication Data
US 2013/0333746 A1 Dec. 19, 2013

(30) Foreign Application Priority Data

Jan. 14, 2011 (DE) .......................... 10 2011 000 140
Feb. 2, 2011 (DE) .......................... 10 2011 000 455

(51) Int. Cl.
*H05K 7/20* (2006.01)
*G06F 1/20* (2006.01)
(Continued)

(52) U.S. Cl.
CPC .............. *H05K 7/20254* (2013.01); *G06F 1/20* (2013.01); *H01L 23/473* (2013.01); *H01L 31/048* (2013.01); *H01L 31/052* (2013.01);
(Continued)

(58) Field of Classification Search
CPC ..... G06F 1/20; H01L 23/473; H01L 31/0521; H01L 31/048; H01L 31/052; H01L 2224/48091; H01L 2224/48137; Y02E 10/50; H05K 7/20254
See application file for complete search history.

(56) References Cited

U.S. PATENT DOCUMENTS 4,248,643 A * 2/1981 Peters .......................... 136/248
4,320,246 A   3/1982 Russell
(Continued)

FOREIGN PATENT DOCUMENTS

CN     1157784 C    7/2004
CN   100404597 C    7/2008
(Continued)

OTHER PUBLICATIONS

International Search Report mailed Jul. 3, 2007, corresponding to PCT/DE2007/000107.
(Continued)

*Primary Examiner* — Matthew Martin
(74) *Attorney, Agent, or Firm* — Ladas & Parry LLP

(57) ABSTRACT

The invention relates to an arrangement and a method for cooling a support (203) having an electronic component, comprising a housing (200) with a base plate (204), a circumferential wall (220) surrounding the support and a cover (211) extending above the support and closing the interior space (230) of the support. The aim is to cool the support directly by a cooling fluid that flows through the base plate without having the risk of damage to the support. In order to achieve said aim, it is proposed that the interior space (230) is subjected to a pressure that is greater than the pressure which is generated by the cooling fluid and is acting upon the support (202).

24 Claims, 2 Drawing Sheets

(51) Int. Cl.
  *H01L 23/473* (2006.01)
  *H01L 31/052* (2014.01)
  *H01L 31/048* (2014.01)
  *H01L 31/054* (2014.01)

(52) U.S. Cl.
  CPC .......... *H01L31/054* (2014.12); *H01L 31/0521* (2013.01); *H01L 2224/48091* (2013.01); *H01L 2224/48137* (2013.01); *Y02E 10/52* (2013.01)

(56) References Cited

U.S. PATENT DOCUMENTS

| | | | | |
|---|---|---|---|---|
| 4,329,246 A | * | 5/1982 | Gilbert et al. | 510/232 |
| 4,361,717 A | * | 11/1982 | Gilmore et al. | 136/246 |
| 2009/0107541 A1 | * | 4/2009 | Linke et al. | 136/246 |

FOREIGN PATENT DOCUMENTS

| | | |
|---|---|---|
| DE | 102004014911 A1 | 10/2004 |
| EP | 0411119 A1 | 2/1991 |
| WO | WO 8909958 A * | 10/1989 |
| WO | 9508844 A | 3/1995 |

OTHER PUBLICATIONS

Bayerer, R., et al.; "Leistungshalbleitermodule in Direkt-Bonding-Technik." Technische Rundschau, Edition Colibri AG., Wabern, Ch., vol. 80, No. 2, Aug. 5, 1988; pp. 38-41, 43, 45; which was cited in the International Search Report mailed Jul. 3, 2007, corresponding to PCT/DE2007/000107.

I. Koch, N. Lescow: "Comparison of different methods of fluid cooling", Annual Report, 2008, Institute for Electrical Machines, Drive Trains and Rails; Cited on p. 2 of the Specification.

* cited by examiner

ARRANGEMENT AND METHOD FOR COOLING A SUPPORT

This application is a 371 of PCT/EP2012/050334, filed on Jan. 11, 2012, which claims priority to German Patent Application No. 10 2011 000140.9, filed on Jan. 14, 2011.

The invention relates to an arrangement for cooling a support having at least one electric and/or electronic component, comprising a housing having an interior space with
- a base plate forming, the bottom of the housing, wherein the support is supported on the base plate and, between the support and the base plate, channels carrying a cooling fluid extend, which are connected to at least one inlet opening and to at least one outlet opening,
- a circumferential wall surrounding the support, and
- a cover extending above the support and closing the interior space of the housing.

The invention also relates to a method for cooling a support having at least one electric and/or electronic component, wherein the support is arranged in a housing having an interior space with
- a base plate which forms the bottom of the housing, and which supports the support via spacer dements,
- a circumferential wall surrounding the support as well as
- a preferably transparent cover which closes the interior space of the housing, wherein, between the support and the base plate, an interstice is present through which a cooling fluid flows, by means of which the support is subjected to a pressure P1.

In WO-A-2010/012491, an open encapsulated concentrator system for solar radiation is disclosed. Here, according to an embodiment example, a photovoltaic module is arranged in a box shaped housing which has a double wall through which a cooling fluid flows. On the radiation side, the housing is closed with glass layers. Furthermore, the module is arranged on a cooling element along whose bottom side cooling water flows.

According to WO-A-2003/095922 (EP-A-790 935), cooling water is run in a meandering coil through a housing on whose cover a substrate having semiconductor components can be arranged in order to cool the substrate. The associated arrangement is suitable for cooling, for example, direct copper bonding (DCB) circuit boards, wherein the cooling water is not applied directly to said circuit boards, because otherwise there is a risk of rupture.

A semiconductor module is disclosed in EP-A-0 411 119. For the cooling of the module, the hitter is arranged on a support and covered by a cooling plate along which a cooling fluid runs. The pipes of cooling fluid are surrounded by a housing which is sealed with respect to the support. To prevent the exit of cooling fluid, a gas flows through the housing, whose pressure is greater than that of the cooling fluid.

From US-A-2006/0 138 452, a power semiconductor module with a housing and a semiconductor layer arranged therein is known. The semiconductor layer is arranged between base plates which in turn contact electrically conductive strip-shaped electrode connection elements. In the housing, cooling elements are arranged which are thermally connected to the electrode connection elements in order to cool them.

The aim of the present invention is to prevent the disadvantages of the prior art in the utilization in particular of large-surface supports, for example, supports having an area between 30 cm$^2$ and 200 cm$^2$ or more. In particular, the aim of the invention is to further develop an arrangement and a method of the type mentioned at the start so that a support is subjected directly to a cooling fluid, even if the support is rupture-sensitive, such as, for example, a direct copper bonding (DCB) circuit board on which solar cells, particularly concentrator solar cells, are interconnected to form a module.

To achieve the aim, it is provided substantially that the interior space is subjected to a pressure that is greater than the pressure which is generated by the cooling fluid and is acting upon the support.

The teaching of the invention can be used particularly in cases where electronic components, such as solar cells, that tend to be associated with high power loss, are arranged on a support.

In particular, the invention relates to the cooling of concentrator solar cell modules. Corresponding modules are used in concentrated sunlight generated by parabolic mirrors or heliostatic mirror arrays. As a result, very high light intensities in the range from 10 W/cm$^2$ to 200 W/cm$^2$ are converted into electrical energy. The thermal power loss of these modules is in the range between 5 W/cm$^2$ and 200 W//cm$^2$, and it is similar to that encountered in high-power electronics. However, in the case of high-power electronics, power losses of only a few centimeters squared are generated, whereas, in the case of concentrator photovoltaic modules, the thermal losses are in the range from 30 cm$^2$ to 200 cm$^2$, so that fetal power losses of several kilowatt occur.

Electronic high-power components 101 can be arranged on direct copper bonded ceramic (DCB) circuit boards, as illustrated, for example, in reference to FIG. 1, which corresponds to a prior art such as this one "I. Koch, N. Lescow; Comparison of different methods of fluid cooling, Annual Report, 2008, Institute for Electrical Machines, Drive Trains and Rails." Here, a support 102 can be arranged on a metal plate of a housing 103 and connected to the latter by means of a soldered layer. The plate has a satisfactory thermal conductivity and it distributes the heat over a larger area. In order to protect the components 101, the pot-shaped open metal housing 103 is filled with soft silicone 109.

The housing 103 or the metal or base plate is screwed onto a water cooler 104, wherein a force fit between the housing 103 and the water cooler 104 occurs in such a manner that a good thermal contact is established. In order to improve the contact further, a heat fat is supplied. Through inlet openings 104, water reaches the water cooler 104, flows through the latter through one or more channels 110, in order to remove heat from the support 101 arranged on the plate.

Here, the channels can be designed in such a manner that the surface is increased and turbulence flows are generated. The water is removed through one or more outlet openings 108.

An arrangement to this effect is suitable for high performance electronics, but not for high concentrator solar cell modules having an area in the range between 20 cm$^2$ and 200 cm$^2$ in comparison to high performance electronics arrangements of a few cm$^2$.

In high performance electronics, the DCB circuit boards are connected by soldering to the base plate made, for example, of copper, to remove the heat. Since the heat expansion coefficient of copper is substantially greater than that of ceramics, in the case of alternating temperature stressing with large-surface contacts, damage to the soldered layer can be observed. Therefore, it is not possible to solder, for example the ceramic layer-containing DCB circuit boards with an area of 10 cm×10 cm, onto a solid copper plate.

An additional disadvantage in the case of large-surface contacts between a support and a housing or plate is the fact that a surface contact between the housing and the support is not ensured to the extent required; instead gaps occur, which reduce the heat transfer with the consequence that an irregular temperature distribution occurs.

Based on the teaching according to the invention, it is not necessary for the support to be connected by material connection to a housing or to a plate in the area of the components. Instead, the possibility exists of subjecting the support directly to cooling fluid, such as cooling water or other cooling liquids, such as a glycerol/water mixture, without any risk of the support breaking due to the pressure of the cooling fluid, since the pressure that is exerted from above onto the support is at least equal to, but in particular greater than, the force exerted by the cooling fluid on the support.

Using procedures of simple design, the possibility exists of cooling large-surface supports directly by exposure to a cooling fluid, without any risk of rupture.

Here, it is provided in particular that the pressure in the interior space of the housing is between 0.2 bar and 1 bar above the pressure exerted by the cooling fluid on the support. The cooling fluid, such as a liquid, is introduced, preferably at a pressure between 0.2 bar and 1 bar above atmospheric pressure, into the interstice between the support and the base plate forming the bottom wall of the housing, wherein it is preferable to use flow rates in the range between 0.3 m/sec and 1 m/sec.

The cooling fluid flows through the interstice between the base plate and the support through channels which are delimited in particular by strip-shaped protrusions that originate from the base plate. Alternatively or additionally, corresponding protrusions can also originate from the bottom side of the support. For this purpose, the support has a corresponding design. In particular, the protrusions of the support are formed from sections of a metallization present on the bottom side of the support or from protrusions applied to the bottom side of the support.

In the case of DCB circuit boards, a design to that effect is possible without problems, wherein, depending on the shape and manufacture of the protrusions, also referred to as fins, the metallization has different thicknesses, or protrusions are formed on the metallization, particularly using the masking technique, which protrude into the interstice between the support and the base plate. As a result, the area of the support that allows the heat transfer is increased. At the same time, the cooling fluid flowing through the channels becomes turbulent, so that the cooling effect is increased.

Possible procedures for forming corresponding protrusions on the bottom side of the support are:
- galvanization using the masking technique,
- current-free precipitation of metal by masking,
- mechanical processing of the metallization for the formation of the protrusions, or
- attachment of corresponding protrusions made of metal, such as metal strips, which are connected by material connection to the bottom side of the support.

Since the support is subjected directly to the cooling fluid and thus the support has to be sealed with respect to said support and the housing, the possibility would exist for cooling fluid to penetrate into the interior space of the housing. However, based on the teaching according to the invention, this is ruled out in principle, since the pressure in the interior space is in principle higher than the pressure of the cooling fluid exerted on the support.

However, the diffusion of components of the cooling medium through the seal cannot be prevented completely. Thus, there is a risk of a slow but steady increase in moisture in the volume to the point of condensation of moisture with decreasing temperature.

To prevent moisture accumulation, it is possible to cause the gas, such as air or nitrogen, to which the interior space is subjected, to flow through the interior space, as a result of which any moisture present can be transported away. For this purpose, the housing, in particular the circumferential wall of the housing, has a corresponding ventilation valve.

The excess pressure within the volume is maintained by feeding in gas, preferably nitrogen, through an inlet opening. In addition, it is possible to connect the volume to a pressure compensation container which lessens pressure variations in the case of varying temperature in the volume.

The gas should be dried or have a relative air humidity between 0% and 60%.

A method of the type mentioned at the start is characterized particularly in that the interior space is subjected to a gas at a pressure $P2$ where $P2 \geq P1$.

The invention proposes preferably that the pressure $P2$ be set to a value of $1.2\,P1$ to $2\,P1$.

In a variant, it is provided that the cooling fluid is introduced at a pressure $P$ where $0.2\,\text{bar} \leq P \leq 1\,\text{bar}$ above atmospheric pressure into the interstice and/or that the flow rate $V$ of the cooling fluid supplied to the interstice is set to $0.3\,\text{m/sec} \leq V \leq 1\,\text{m/sec}$.

Further details, advantages and characteristics of the invention can be obtained not only from the claims and the features that can be taken from them—separately and/or in combination—, but also from the following description of preferred embodiment examples that can be seen in the drawing.

FIGS. 4a)-c) show manufacturing steps for forming protrusions, and

Figure 5:
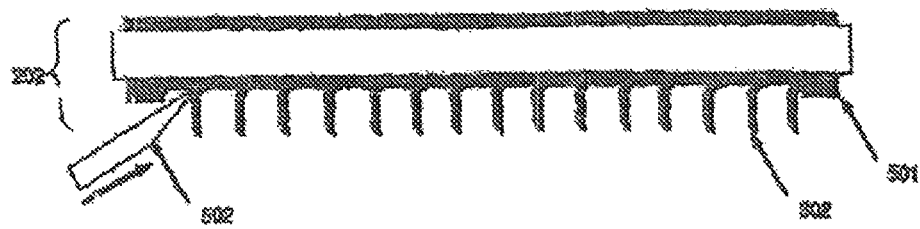

FIG. 5 shows an additional embodiment of a support.

Figure 1:
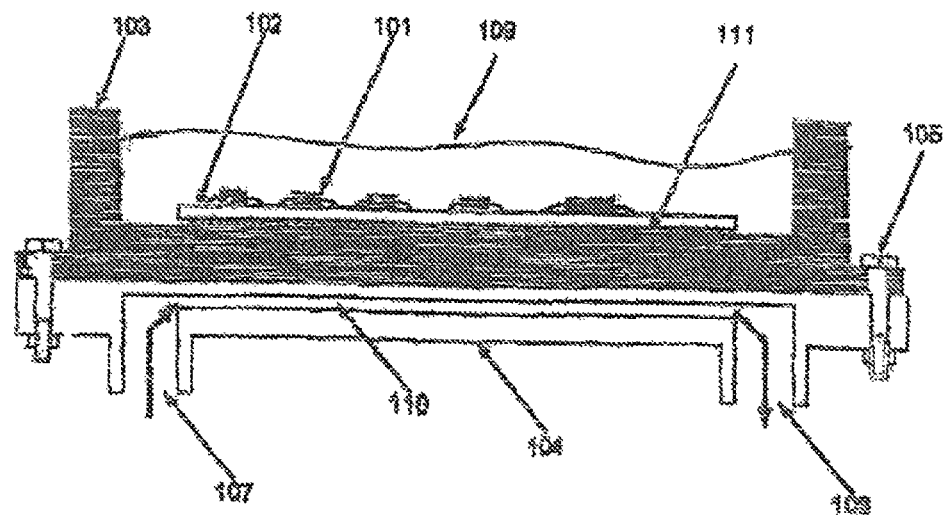
FIG. 1 shows a cooling arrangement according to the prior art.
Figure 2:
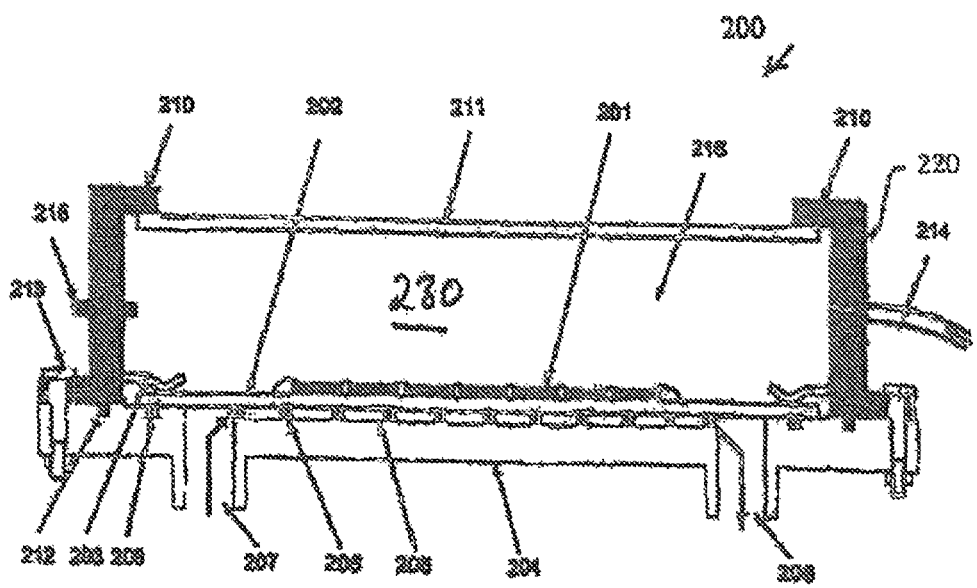
FIG. 2 shows an arrangement according to the invention for cooling a support.

In FIG. 2 one can see a basic representation of an arrangement according to the invention for cooling a support 202. The support 202 can be a ceramic plate which has a bottom-side metallization made of copper, in particular, and a top-side conductor strip structure made of copper, for example, for connecting solar cells 201. The solar cells 201 and the support 202—which, in particular, consists of a DCB circuit board—form a module, wherein, according to the invention, a high concentrator solar cell module, in particular, is to be cooled.

The support 202 is arranged in a housing 200, in particular on a metal plate 204 made of copper or aluminum, for example, which is used as a bottom of the housing 200. To the bottom or metal plate 204, a hood 210 is secured by means of screws, wherein, by means of a sealing element, such as an O ring 212, a sealing between the hood 210 and the base plate 204 occurs. The hood 210 consists of a circumferential wall 220 and a transparent cover 211 extending above and spaced from the support 202. The spacing between the top side of the solar cells 201 and the bottom side of the cover 211 can be in the range between 1 mm and 20 cm.

The area of the support 202, also referred to as a circuit board, is between 3 cm×3 cm and preferably 20 cm×20 cm, although larger supports 202 can also be considered. The solar cells 201 to be interconnected to form a module have a smaller area than that of the support 202. The support 202 is moreover subjected via safety devices, such as clamping elements 203, to a force in the direction of the base plate 204, wherein a seal, such as an O ring 209, extends in the marginal area.

The support 202 is, in particular, a direct copper bonding (DCB) circuit board, which usually has an area of more than 10 cm×10 cm, and which is directly water cooled on the basis of the teaching according to the invention.

As can be seen in the graphic representation, the base plate 204 is penetrated by one or more inlets 207 and one or more outlets 208. Through the inlet, a cooling fluid, such as cooling water or, for example, a glycerol/water mixture, is fed into an interstice extending between the bottom side of the support 202 and the top side of the base plate 204, in order to remove dissipated heat from the support—also referred to as support plate 202. For this purpose, channels 205 delimited by protrusions 206 extend in the interstice between the support plate 202 and the base plate 204, protrusions by means of which the support 203 is supported on the base plate 204. The protrusions 206 can originate from the base plate 205 or from the bottom side of the support 202. However, the possibility also exists that protrusions originate both from the base plate 205 and also from the support 202, which then mutually engage into each other with mutual spacing.

Furthermore, the possibility exists of inserting spacers into the slit between the base plate 204 and the support 202, spacers which optionally replace or supplement the protrusions.

In particular, it is provided that microfins having a height of 0.5 mm to 5 mm originate from the rear side of the support 202, as protrusions, by means of which the fluid flowing through the channels 205, such as water or a glycerol/water mixture, is distributed, and turbulent flow is generated. At the same time, the area of contact of the rear side of the support 202 with the cooling fluid is increased. It is preferable that the protrusions, such as fins, starting out from the support 202, extend oriented transversely in the direction of the water flow, as a result of which the turbulence effect is increased.

The formation of the protrusions or microfins protruding from the bottom side of the support 202 can occur, for example, in one of the following ways:

The fins are grown galvanically on the rear side metallization which can consist of copper or aluminum. A mask with fine slits here defines the structure.

The fins are peeled out of the rear side metallization on the circuit board.

The fins are etched out of a thick rear side metallization layer.

The fins are welded or soldered to the rear side. For this purpose, appropriate small metal bands can be used.

The cover 211 can be a white glass or a quartz glass. The cover 211 is mechanically secured in a fixed position relative to the circumferential wall 220 and it is sealed by a high temperature resistant seal, so that the interior space 230 is sealed with respect to the environment.

In order to prevent the support 202 from breaking due to the cooling fluid flowing through the channels 205 and to the associated pressure application, it is provided according to the invention that the interior space 230 is subjected via an opening 214 to a gas, such as nitrogen, in such a manner that the interior space 230 is exposed to excess pressure relative to the pressure exerted by the cooling fluid on the support 202, so that the support 202 cannot rupture. In particular, it is provided that the interior space 230 can be subjected to an excess pressure of 0.2 bar to 1 bar relative to the pressure generated by the cooling fluid.

The cooling fluid can be supplied at an excess pressure in the range from preferably 0.2 bar to 1 bar relative to atmospheric pressure via the feed line 207 into the interstice. The flow rate of the fluid should be between 0.3 m/sec and 1 m/sec.

As a result of the excess pressure present in the interior space 230 relative to the pressure generated by the cooling liquid, it is ensured that the liquid cannot penetrate into the interior space 230. In addition, at the time of diffusion of moisture into the interior space, it is ensured that, in spite of this, a dry atmosphere is present in the interior space 230, since gas is continually removed through a ventilation valve 215 from the internal pipe 230.

The counter pressure in the interior space 230 enables water cooling, particularly of large surface ceramic supports, which otherwise would burst unavoidably due to the existing water pressure.

The side walls 202 of the housing 200, which form a portion of the hood, also consist of metal, such as copper or aluminum.

During operation, highly concentrated light passes through the cover 211 and hits the photovoltaic module, which is made from the solar cells 201 and the support 202. The light intensity is sufficient to melt uncooled metal parts. Therefore, it is advantageous to ensure a good heat conductivity between the circumferential wall 220 and the base plate 204. The base plate 204, also referred to as bottom wall, is in direct contact with the water flow and it is therefore cooled actively.

In an embodiment of the invention, as mentioned, the rear side of the support 202, also referred to as ceramic plate, can be designed so that the heat transfer to the water is improved. Usually, the rear side of a corresponding support plate, which comprises a ceramic layer, is designed as a DCB circuit board with a continuous copper layer connected to the ceramic layer.

Figure 3:
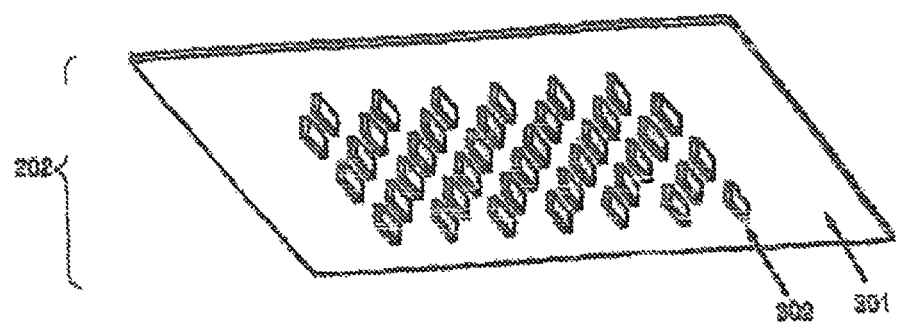
FIG. 3 shows a bottom side of a support.

According to FIG. 3, the rear side of the support 202 or of the ceramic plate is constructed so that the contact area between the support 202 and the water flowing in the interstice is increased and, at the same time, turbulent water flow is promoted. In particular, the rear side 301 can be constructed in such a manner that there are small fins 302 having a height in the range of 1 mm~5 mm and a narrow spacing.

These fins or protrusions 302 can also be used as support for the support 202, which is as support on the top side of the base plate 204. In this case, it is not absolutely necessary for protrusions 206 to protrude from the base plate 201.

The protrusions or fins protruding from the rear side 301 of the support 202 can be designed according to FIGS. 4 and 5 as follows. Thus, the possibility exists of attaching a baffle 402 with a pattern made of slits on the rear side metallization 401 of the support 202. The rear side 401 is galvanized, for example, with copper, or it is chemically coated. Another suitable metal can also be considered. The depositing metal fills the slits in the baffle 402 or mask, and then forms the fins.

After removing the baffle 402, an arrangement of the firms or protrusions remains on the rear side of the support 202.

Figure 4:
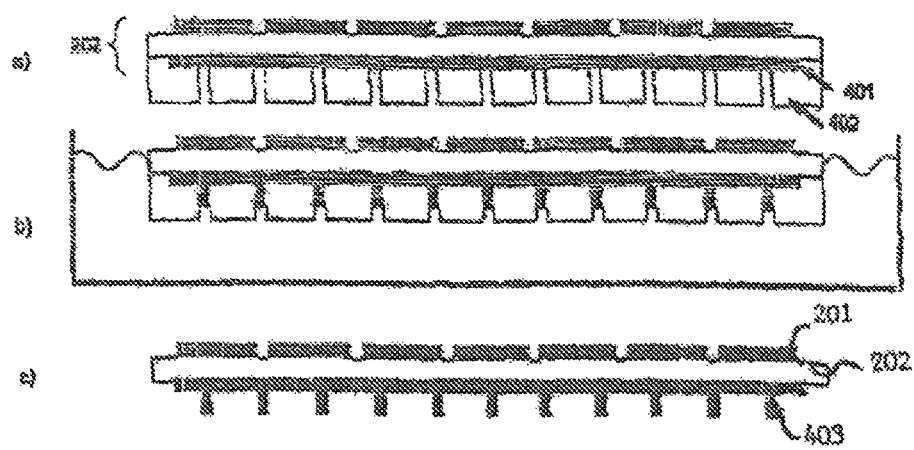

The course of the procedure can be seen in FIG. 4. The fins or protrusions are marked with the reference numeral 403.

According to FIG. 5, the possibility also exists of providing the support 202 with a rather thick rear side metallization 501 having a thickness of 1 mm, for example. Then, the fins are lifted or peeled off by means of a mechanical tool 502 from the rear side metallization.

The possibility also exists of applying, for example, by welding, soldering, or gluing, sections of, for example, a metal band or a metal wire, onto the rear side metallization 301. Procedures such as electric welding, ultrasound welding, thermocompression welding, soldering, direct copper bonding or other methods can also be used.

Furthermore, the fins can be applied, for example, in a multilayer sieve printing process and then sintered.

The invention claimed is:

1. A device for cooling a support having an electric or electronic component connected thereto, said device comprising a housing having:
   a base plate comprising an inlet opening and an outlet opening;
   wherein the base plate is in contact with the support;
   a peripheral wall extending from the base plate and surrounding the support;
   a cover disposed on the peripheral wall;
   wherein the base plate, the peripheral wall, and the cover define a closed internal space;
   a plurality of channels extending between an interstice between a lower surface of the support that faces the interstice, and an upper surface of the base plate that faces the interstice;
   wherein said channels are connected to the inlet opening and the outlet opening in the base plate;
   a cooling fluid disposed in the plurality of channels;
   a gas disposed in the internal space;
   wherein a pressure of the gas in the internal space is greater than a pressure of the cooling fluid in the plurality of channels.

2. The device according to claim 1, wherein the channels are defined by a member selected from the group consisting of protrusions extending from the lower surface of the support, protrusions extending from the upper surface of the base plate, and protrusions extending from both the lower surface of the support and from the upper surface of the base plate.

3. The device according to claim 2, wherein the support is supported on the base plate by the protrusions.

4. The device according to claim 2, wherein the protrusions are in the form of a member selected from the group consisting of a strip, fin, and lamella.

5. The device according to claim 2, further comprising a metallization on the lower surface of the support, and wherein the protrusions extending from the lower surface of the support are formed on the metallization.

6. The device according to claim 5, wherein the support is supported on the base plate by the protrusions extending from the lower surface of the support that are formed on the metallization.

7. The device according to claim 1, wherein the cover is transparent.

8. The device according to claim 1, wherein the electronic component is a solar cell.

9. The device according to claim 1, further comprising a ventilation valve connecting the internal space to outside air.

10. The device according to claim 9, wherein the ventilation valve passes through the peripheral wall.

11. The device according to claim 1, wherein the gas is dry or has a relative air humidity between 0% and 60%.

12. The device according to claim 1, wherein the gas is air or nitrogen.

13. The device according to claim 1, wherein the support is sealingly connected to the base plate.

14. A method for cooling a support having an electric or electronic component connected thereto, said method comprising,
   providing a housing, said housing having:
   a base plate having an inlet opening and an outlet opening;
   wherein the base plate is in contact with the support;
   a peripheral wall extending from the base plate and surrounding the support;
   a cover disposed on the peripheral wall;
   wherein the base plate, the peripheral wall, and the cover define a closed internal space;
   an interstice between a lower surface of the support and an upper surface of the base plate;
   providing a cooling fluid in the interstice at a pressure $P1$; and
   providing a gas in the internal space at a pressure $P2$;
   wherein $P2 \geq P1$.

15. The method according to claim 14, comprising providing a direct copper bonding circuit board as the support.

16. The method according to claim 14, comprising providing a transparent cover as the cover.

17. The method according to claim 14, wherein 0.2 bar $P1 \leq P1 \leq 1$ bar above atmospheric pressure.

18. The method according to claim 14, wherein a flow rate $V$ of the cooling fluid is 0.3 m/sec $\leq V \leq 1$ m/sec.

19. The method according to claim 14, wherein $P2$ is from 1.2 $P1$ to 2 $P1$.

20. The method according to claim 14, further comprising:
   providing a metallization on the lower surface of the support; and
   forming protrusions on the metallization.

21. The method according to claim 20, wherein the protrusions are formed by a member selected form the group consisting of:
   galvanization using a masking technique;
   current-free coating using a masking technique;
   mechanical processing of the metallization; and
   securing the protrusion to the metallization using a strip-shaped metallic element.

22. The method according to claim 21, wherein the strip-shaped metallic element is a metal band or metal wire.

23. The method according to claim 14, further comprising providing a ventilation valve connecting the internal space of the housing to outside air.

24. The method according to claim 23, wherein the ventilation valve passes through the peripheral wall.

* * * * *